(12) United States Patent
Taylor et al.

(10) Patent No.: US 8,711,113 B2
(45) Date of Patent: Apr. 29, 2014

(54) MODULAR CONNECTOR FOR TOUCH SENSITIVE DEVICE

(75) Inventors: Gordon F. Taylor, Bolton, MA (US); Thomas J. Rebeschi, Merrimack, NH (US)

(73) Assignee: 3M Innovative Properties Company, St. Paul, MN (US)

( * ) Notice: Subject to any disclaimer, the term of this patent is extended or adjusted under 35 U.S.C. 154(b) by 437 days.

(21) Appl. No.: 13/022,036

(22) Filed: Feb. 7, 2011

(65) Prior Publication Data
US 2012/0200506 A1   Aug. 9, 2012

(51) Int. Cl.
*G06F 3/041* (2006.01)

(52) U.S. Cl.
USPC ........................................ 345/173; 178/18.03

(58) Field of Classification Search
USPC ......... 345/173–178; 178/18.03, 18.05, 18.06, 178/18.07, 18.01
See application file for complete search history.

(56) References Cited

U.S. PATENT DOCUMENTS

| | | | | |
|---|---|---|---|---|
| 4,730,186 | A | * | 3/1988 | Koga et al. ................... 345/179 |
| 6,118,433 | A | * | 9/2000 | Jenkin et al. |
| 6,239,389 | B1 | * | 5/2001 | Allen et al. ................ 178/18.01 |
| 6,377,228 | B1 | * | 4/2002 | Jenkin et al. .................. 345/1.3 |
| 6,380,931 | B1 | * | 4/2002 | Gillespie et al. .............. 345/173 |
| 6,778,167 | B2 | * | 8/2004 | Ohashi ......................... 345/173 |
| 7,745,733 | B2 | | 6/2010 | Jambor et al. |
| 2010/0097344 | A1 | | 4/2010 | Verweg |
| 2010/0117986 | A1 | | 5/2010 | Yang |
| 2010/0300773 | A1 | | 12/2010 | Cordeiro et al. |
| 2011/0007030 | A1 | | 1/2011 | Mo |
| 2011/0095999 | A1 | * | 4/2011 | Hayton ........................ 345/173 |
| 2012/0086659 | A1 | * | 4/2012 | Perlin et al. ................... 345/173 |

OTHER PUBLICATIONS

International Search Report, Form PCT/ISA/210, International Application No. PCT/US2012/023417, International Filing Date: Feb. 1, 2012, 3 pages.

\* cited by examiner

*Primary Examiner* — Dmitriy Bolotin
(74) *Attorney, Agent, or Firm* — Robert S. Moshrefzadeh

(57) ABSTRACT

Apparatus for providing modular connection means to electrodes in a touch-sensitive device. The modular connections may include electronics allowing controlling electronics to individually address electrodes associated with driving electrodes and sensing signals occurring on electrodes.

25 Claims, 4 Drawing Sheets

MODULAR CONNECTOR FOR TOUCH SENSITIVE DEVICE

BACKGROUND

Touch sensitive devices allow a user to conveniently interface with electronic systems and displays by reducing or eliminating the need for mechanical buttons, keypads, keyboards, and pointing devices. For example, a user can carry out a complicated sequence of instructions by simply touching an on-display touch screen at a location identified by an icon.

There are several types of technologies for implementing a touch sensitive device including, for example, resistive, infrared, capacitive, surface acoustic wave, electromagnetic, near field imaging, etc. Capacitive touch sensing devices have been found to work well in a number of applications. In many touch sensitive devices, the input is sensed when a conductive object in the sensor is capacitively coupled to a conductive touch implement such as a user's finger. Generally, whenever two electrically conductive members come into proximity with one another without actually touching, a capacitance is formed therebetween. In the case of a capacitive touch sensitive device, as an object such as a finger approaches the touch sensing surface, a tiny capacitance forms between the object and the sensing points in close proximity to the object. By detecting changes in capacitance at each of the sensing points and noting the position of the sensing points, the sensing circuit can recognize multiple objects and determine the characteristics of the object as it is moved across the touch surface.

There are two known techniques used to capacitively measure touch. The first is to measure capacitance-to-ground, whereby a signal is applied to an electrode. A touch in proximity to the electrode causes signal current to flow from the electrode, through an object such as a finger, to electrical ground.

The second technique used to capacitively measure touch is through mutual capacitance. Mutual capacitance touch screens apply a signal to a driven electrode, which is capacitively coupled to a receiver electrode by an electric field. Signal coupling between the two electrodes is reduced by an object in proximity, which reduces the capacitive coupling.

Touch sensitive devices that capacitively measure touch are sometimes comprised of one or more electrode arrays extending across of transparent, touch sensitive surface. The number of electrodes that comprise such electrode arrays can be quite large, for example fifty or more such electrodes are possible. Further, for touch sensitive devices disposed in front of electronically addressable displays (such as liquid crystal or plasma displays), the number of electrodes in such electrode arrays is a function of the size of the display, and the number of electrodes that comprise an electrode array can grow to the hundreds. The individual electrodes are electrically connected to controller electronics with one or more flexible circuit tails having one conductor for each electrode in the electrode array, that is, an electrode array having 48 electrodes might have four tail connectors fastened thereto, each coupling twelve of the electrodes to controller electronics.

SUMMARY

A modular connector for use with a touch sensitive device is described herein. In certain embodiments, a series of modular connector, or modular circuits, used in conjunction with a touch panel may greatly reduce the number of conductors included in a tail that couples controller electronics to individual electrodes use in a touch panel of a touch sensitive device. For example, in a touch panel having an electrode array that includes 48 electrodes, rather than having one or more tails that connect, one-to-one, controller pins to electrodes in the electrode array using flexible circuit ribbon tails, a single, relatively simple circuit tail that includes only several conductors may be used to electrically couple to the electrodes in the electrode array. This feature may be useful for any size of touch panel, but may particularly benefit larger touch panels (e.g., 50 or more inches, diagonal) that have electrode arrays that number in the dozens or even hundreds, where traditional means of coupling touch panel electrodes to controller electronics would become unruly.

One embodiment described herein includes a modular connector for use with a touch sensor comprising at least one array of electrodes disposed proximate a touch sensitive area, comprising: a substrate; a modular control unit disposed on the substrate; an electrode interface disposed on the substrate and communicatively coupled to the control unit, the electrode interface including a plurality of terminal areas for making electrical connections with a subset of the array of electrodes; one or more inter-module interfaces disposed on the substrate and communicatively coupled to the control unit, the inter-module interfaces including a plurality of terminal areas for making electrical connections to other modular connectors; and wherein the terminal areas of the electrode interface are individually addressable by communication signals provided to the modular control unit via the inter-module interfaces.

A further embodiment described herein includes a touch sensor comprising: an array of electrodes, the array comprising a plurality of electrodes proximate a touch sensitive area of the touch sensor; and a plurality modular connectors interconnected together, each modular connector electrically coupled to a subset of the array of electrodes.

This and other embodiments are included within the scope of this disclosure.

BRIEF DESCRIPTION OF DRAWINGS

In the figures, like reference numerals designate like elements.

DETAILED DESCRIPTION OF ILLUSTRATIVE EMBODIMENTS

Figure 1:
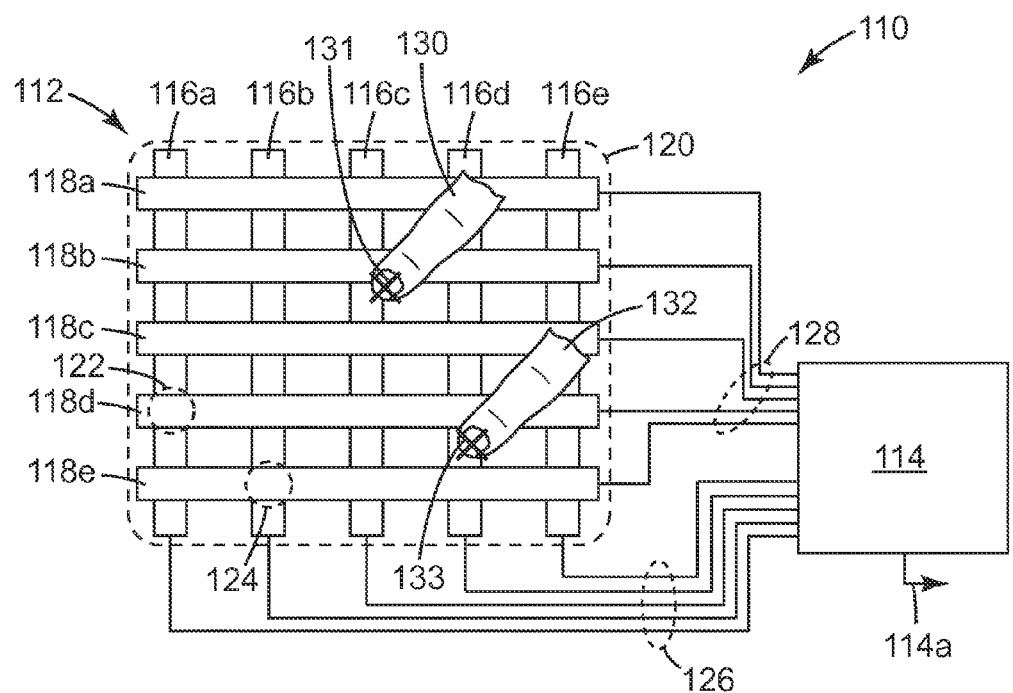
FIG. 1 is a schematic view of a touch device.

In FIG. 1, an exemplary touch device 110 is shown. The device 110 includes a touch panel 112 connected to electronic circuitry, which for simplicity is grouped together into a single schematic box labeled 114 and referred to collectively as a controller.

The touch panel 112 is shown as having a 5×5 matrix of column electrodes 116*a-e* and row electrodes 118*a-e*, but other numbers of electrodes and other matrix sizes can also be used. The panel 112 is typically substantially transparent so that the user is able to view an object, such as the pixilated display of a computer, hand-held device, mobile phone, or other peripheral device, through the panel 112. The boundary 120 represents the viewing area of the panel 112 and also preferably the viewing area of such a display, if used. The electrodes 116a-e, 118a-e are spatially distributed, from a plan view perspective, over the viewing area 120. For ease of illustration the electrodes are shown to be wide and obtrusive, but in practice they may be relatively narrow and inconspicuous to the user. Further, they may be designed to have variable widths, e.g., an increased width in the form of a diamond- or other-shaped pad in the vicinity of the nodes of the matrix in order to increase the inter-electrode fringe field and thereby increase the effect of a touch on the electrode-to-electrode capacitive coupling. In exemplary embodiments the electrodes may be composed of indium tin oxide (ITO) or other suitable electrically conductive materials. From a depth perspective, the column electrodes may lie in a different plane than the row electrodes (from the perspective of FIG. 1, the column electrodes 116a-e lie underneath the row electrodes 118a-e) such that no significant conductive contact is made between column and row electrodes, and so that the only significant electrical coupling between a given column electrode and a given row electrode is capacitive coupling. In other embodiments, the row electrode and discreet column electrode components may be disposed on the same substrate, in the same layer, then bridging jumper electrodes configured to connect the discreet column electrode components (spaced apart from the column electrode by a dielectric) to thus form x- and y-electrodes using a substantially single layer construction. The matrix of electrodes typically lies beneath a cover glass, plastic film, or the like, so that the electrodes are protected from direct physical contact with a user's finger or other touch-related implement. An exposed surface of such a cover glass, film, or the like may be referred to as a touch surface.

The capacitive coupling between a given row and column electrode is primarily a function of the geometry of the electrodes in the region where the electrodes are closest together. Such regions correspond to the "nodes" of the electrode matrix, some of which are labeled in FIG. 1. For example, capacitive coupling between column electrode 116a and row electrode 118d occurs primarily at node 122, and capacitive coupling between column electrode 116b and row electrode 118e occurs primarily at node 124. The 5×5 matrix of FIG. 1 has 25 such nodes, any one of which can be addressed by controller 114 via appropriate selection of one of the control lines 126, which individually couple the respective column electrodes 116a-e to the controller, and appropriate selection of one of the control lines 128, which individually couple the respective row electrodes 118a-e to the controller.

When a finger 130 of a user or other touch implement comes into contact or near-contact with the touch surface of the device 110, as shown at touch location 131, the finger capacitively couples to the electrode matrix. The finger capacitively couples to the matrix, and draws charge away from the matrix, particularly from those electrodes lying closest to the touch location, and in doing so it changes the coupling capacitance between the electrodes corresponding to the nearest node(s). For example, the touch at touch location 131 lies nearest the node corresponding to electrodes 116c/118b. As described further below, this change in coupling capacitance can be detected by controller 114 and interpreted as a touch at or near the 116a/118b node. Preferably, the controller is configured to rapidly detect the change in capacitance, if any, at all of the nodes of the matrix, and is capable of analyzing the magnitudes of capacitance changes for neighboring nodes so as to accurately determine a touch location lying between nodes by interpolation. Furthermore, the controller 114 advantageously is designed to detect multiple distinct touches applied to different portions of the touch device at the same time, or at overlapping times. Thus, for example, if another finger 132 touches the touch surface of the device 110 at touch location 133 simultaneously with the touch of finger 130, or if the respective touches at least temporally overlap, the controller is preferably capable of detecting the positions 131, 133 of both such touches and providing such locations on a touch output 114a. The number of distinct simultaneous or temporally overlapping touches capable of being detected by controller 114 is preferably not limited to 2, e.g., it may be 3, 4, or more, depending on the size of the electrode matrix.

Controller 114 may employ a variety of circuit modules and components that enable it to rapidly determine the coupling capacitance at some or all of the nodes of the electrode matrix. For example, the controller may include at least one signal generator or drive unit. The drive unit delivers a drive signal to one set of electrodes, referred to as drive electrodes. In the embodiment of FIG. 1, the column electrodes 116a-e may be used as drive electrodes, or the row electrodes 118a-e may be so used. The drive signal may be delivered to the electrodes in various ways, e.g., one drive electrode at a time in a scanned sequence from a first to a last drive electrode. As each such electrode is driven, the controller monitors the other set of electrodes, referred to as receive electrodes. The controller 114 may include one or more sense units coupled to all of the receive electrodes. Circuits suitable for sensing multiple contacts made to touch panel 112 are further described in US Patent Application Publication No. 2010/0300773, "High Speed Multi-Touch Device and Controller Therefor."

The controller may also include circuitry to accumulate charge from a series of response signal inputs. Exemplary circuit devices for this purpose may include one or more charge accumulators, e.g., one or more capacitors, the selection of which may depend on the nature of the drive signal and the corresponding response signal. Each pulse results in the accumulation of some quantum of charge and each additional pulse adds successively more. The charge may also be coupled in one cycle and any extra pulses may just allow averaging of the charge for noise reduction. The controller may also include one or more analog-to-digital converters (ADCs) to convert the analog amplitude of the accumulated signal to a digital format. One or more multiplexers may also be used to avoid unnecessary duplication of circuit elements. Of course, the controller also preferably includes one or more memory devices in which to store the measured amplitudes and associated parameters, and a microprocessor to perform the necessary calculations and control functions.

By measuring the voltage of the accumulated charge associated with the response signal for each of the nodes in the electrode matrix for one or more pulses associated with a given measurement cycle, the controller can generate a matrix of measured values related to the coupling capacitances for each of the nodes of the electrode matrix. These measured values can be compared to a similar matrix of previously obtained reference values in order to determine which nodes, if any, have experienced a change in coupling capacitance due to the presence of a touch.

Figure 2:
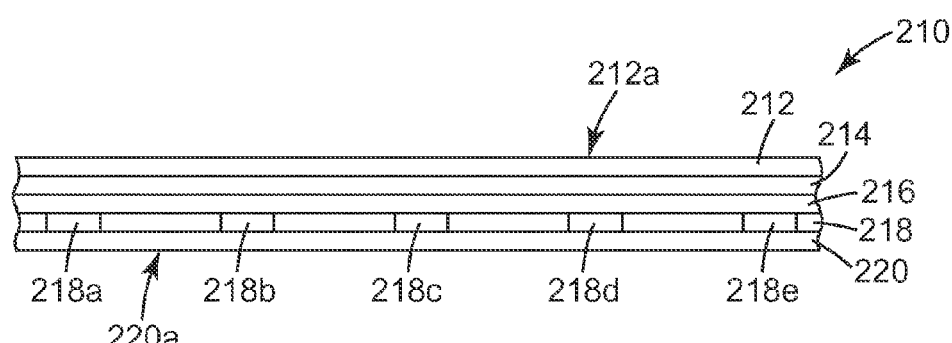
FIG. 2 is a schematic side view of a portion of a touch panel used in a touch device.

Turning now to FIG. 2, we see there a schematic side view of a portion of a touch panel 210 for use in a touch device. The panel 210 includes a front layer 212, first electrode layer 214 comprising a first set of electrodes, insulating layer 216, second electrode layer 218 comprising a second set of electrodes 218a-e preferably orthogonal to the first set of electrodes, and a rear layer 220. The exposed surface 212a of layer 212, or the exposed surface 220a of layer 220, may be or comprise the touch surface of the touch panel 210.

Figure 3:
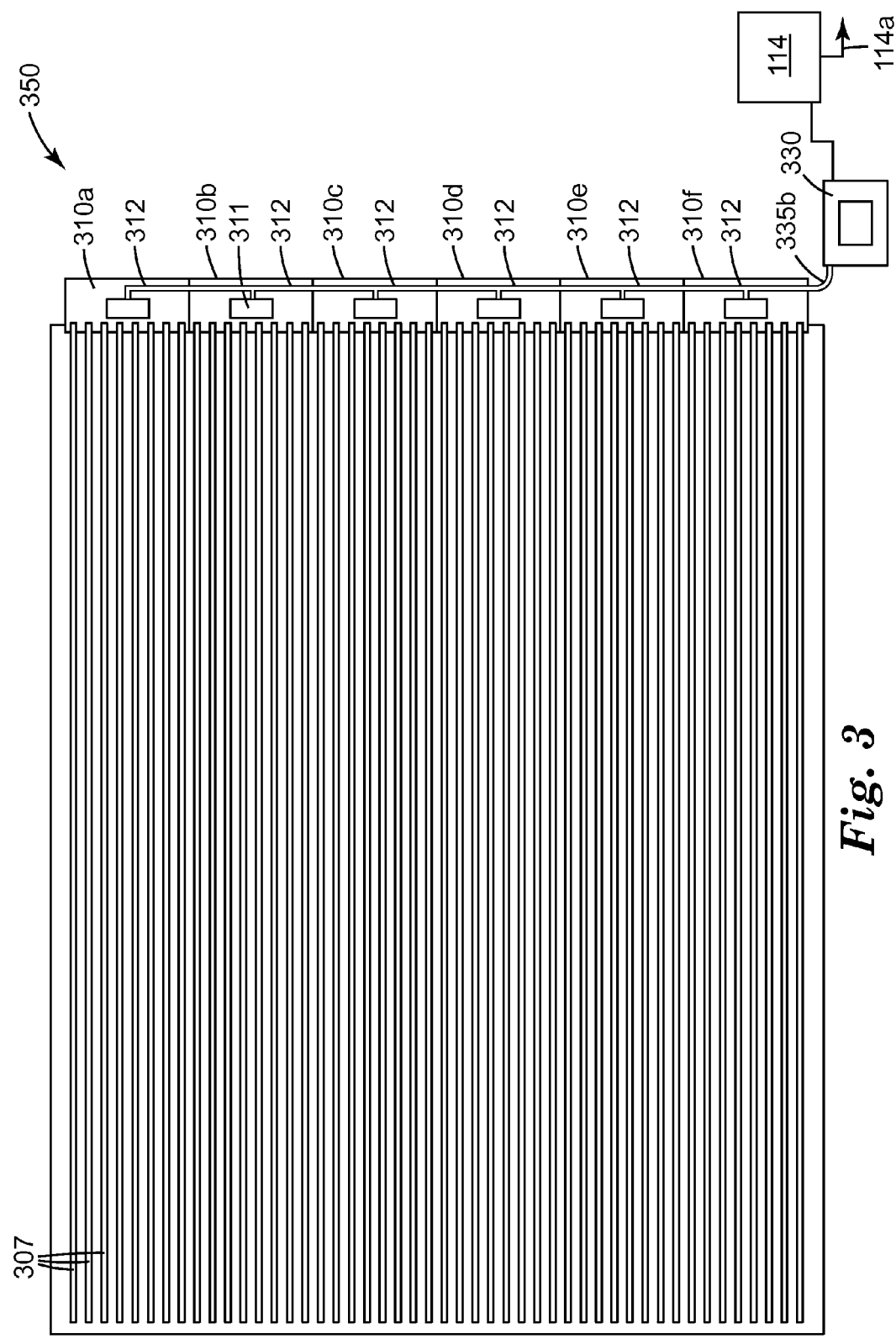
FIG. 3 is a schematic view of an electrode array coupled with modular connectors.

FIG. 3 shows electrode array 350 having modular connectors. Such an electrode array 350, in one embodiment, would comprise row (or column) electrodes associated with an X- (or Y-) electrode array in a touch panel. Two such electrode arrays could be combined to form a matrix-type touch panel, as will be seen in FIG. 4. Electrode array 350 includes a plurality of individual row electrodes (e.g. row electrodes 307), which are similar or the same in construction as to row electrodes 118a-e as described in FIG. 1, but more in number. For example, subsets of eight contiguously located row electrodes 350 comprise a subset of row electrodes, and are electrically coupled, by a Z-axis adhesive, solder, or other connection means, to an electrode interface disposed on each of the modular connectors 310a-f. On larger touch panels, 25 or more electrodes could define the number of row electrodes coupling to a modular connector. Thus the 48 row electrodes are illustrated as electrically coupled to six modular connectors. While subsets of eight electrodes coupling to a given modular connector are described herein, this is strictly a design choice and other numbers of electrodes are possible.

The modular connectors 310a-f, described in more detail in FIG. 3, each include a substrate, such as a printed circuit board (PCB), a flex circuit board, or some combination thereof, upon which modular connector electronics (e.g. modular connector electronics 311, associated with modular connector 310b) are disposed. The modular connector electronics communicatively couple the electrode interface, and thus the electrodes in a given subset of electrodes. The modular connector is also communicatively coupled to inter-module communication bus 312, which communicatively couples contiguously located modular connectors, and ultimately to inter-module controller 330.

Inter-module communication bus 312 comprises, in one embodiment, a plurality of conductors which may carry signals that facilitate control of the modular connector electronics associated with a given modular connector. Inter-module communications bus 312 is communicatively coupled to inter-module controller 220 by tail 335, which in one embodiment is a bundle of conductors that correspond to the number of conductors that comprise inter-module communications bus 312. In one embodiment, the number of conductors that comprise the inter-module communication bus 312 is four, but other numbers of conductors are possible. Such control signals are, in one embodiment, provided by inter-module control unit 330, and provide for individual addressing one or more individual electrodes in electrode array 350. For example, controller 114, which is communicatively coupled to inter-module controller (and though not shown as such in FIG. 3, may both exist on the same substrate or in the same application specific integrated circuit (ASIC)), may individually address row electrodes 350 and thereby apply, for example, drive signals to the row electrodes one at a time. One exemplary embodiment of an inter-module communication bus comprises is a three conductor serial bus implementing the Serial Peripheral Interface (SPI). Other communication protocols that operate over three wires are also possible, for example the Queued Serial Peripheral Interface (QSPI) and the Microwire or Microwire Plus protocols. If the inter-module communication bus is comprised of two conductors, exemplary protocols include the Inter-Integrated Circuit (I2C) protocol or the System Management Bus (SMBus). Each communication protocol, as well as the design of the conductors suitable for such, has advantages and disadvantages. A custom SMBus may also be defined. In one embodiment, the inter-module communication bus includes dedicated input/output conductors, as well as a clock conductor. Additional conductors supply power voltages and ground lines, as necessary, to operate electronics included on the modular connectors.

Modular connector electronics may include one or more ASICs or circuitry that allows for individual addressing of the subset of row electrodes coupled thereto, by an inter-module controller or other electronics. Since one or more ASICs could be custom designed to allow addressing of associated electrodes via the intermodal communications bus. Additionally, modular connector electronics may include circuitry associated with driving row electrodes, or detecting signals occurring on row electrodes, as the case may be. For example, in the case where the modular connectors are coupled to electrodes that are to be driven with a signal, modular connector electronics may include a drive signal generator such that communications signals provided by inter-module controller 330 cause the drive signal generator of a given modular connector to apply a signal to an individual row.

In a further case where the modular connectors are coupled to electrodes that are associated with receiving or detecting signals, modular connector electronics may include sense circuits that might include peak detectors or integrating capacitors. In one embodiment, such sense circuitry is associated with each electrode electrically coupled to the modular connector, and the modular connector electronics allows this sense circuitry to be sampled, reset, or otherwise controlled via an exchange of communication signals from inter-module controller 330 and/or controller 114. In a further embodiment, inter-module controller 330 and controller 114 are the same unit.

Figure 4:
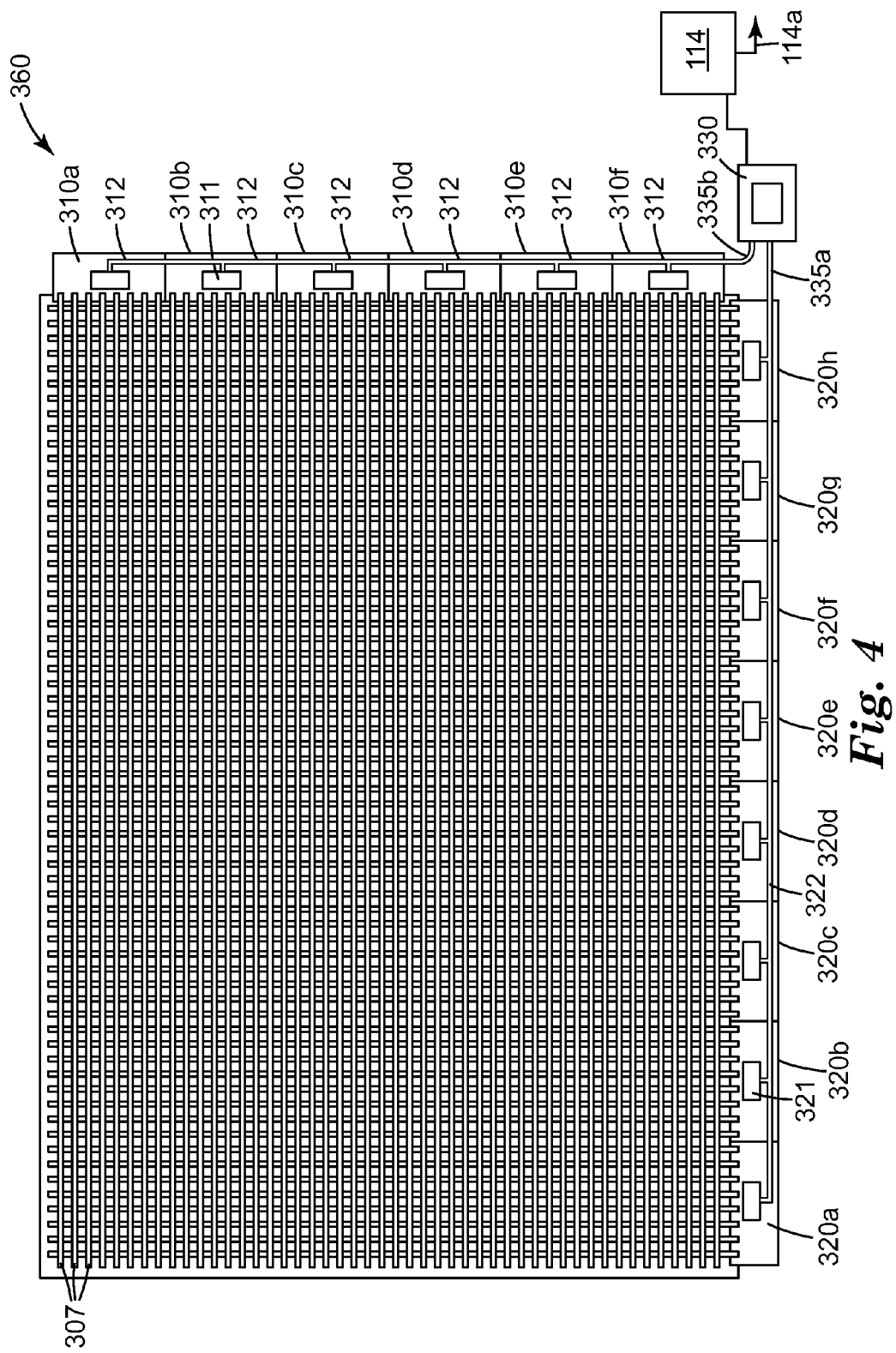
FIG. 4 is a schematic view of the electrode array of FIG. 4 coupled with a further electrode array to form a touch panel; and, FIG. 5 is a schematic view of a modular connector.

Turning now to FIG. 4, we see touch panel 360, which includes electrode array (rows) as described in FIG. 3 with a further array of electrodes (columns), separated by a dielectric in a construction described with respect to FIGS. 1 and 2. The additional column array is similar to electrode array 350, mutatis mutandis. The row and column electrodes are orthogonally oriented, though other orientations are possible. Modular connectors 320a-h are shown coupled to one another, conductors disposed thereon forming inter-module communication bus 322. Modular connector electronics (e.g. modular connector electronics 321, associated with modular connector 320b) are disposed on each modular connector. The inter-module communications bus 322 is coupled to tail 335a, which is in turn coupled to controller 114. Controller 114 is coupled to, for example, a host computer, per connector 114a.

Modular connectors may be electrically coupled together with traditional soldering techniques, a Z-axis adhesive, or with male/female plugs. Additionally, the substrates associated with the modular connectors may be couple together by mechanical snapping means, or they may be secured to each other with known adhesives. In one embodiment, the modular connectors are on a single, continuous substrate, for example a single piece of PCB that was custom created for pairing with a particular number of touch panel conductors. The modular connectors may be coupled to the touch panel substrate via adhesives, including Z-axis electrical adhesives coupled to the modular connectors electrode interface. Flexible ribbon circuits may also be used therewith. Modular electronics controller 330 and controller 114 in one embodiment may exist on the same substrate as both the plurality of modular connectors associated with the X- or Y-electrode array.

Though modular connectors are shown in FIG. 4 associated with a two electrode layer matrix-type touch panel, the modular connectors could instead be used on any touch panel having electrodes used for sensing the presence of an object proximate a touch sensitive surface, such as a finger. For example, modular connectors could be used in conjunction with touch applications that are single touch only, and/or do not determine touch position on both X- and Y-axis. Further, the touch panel need not be light transmissive, or intended to be disposed in front of an electronically addressable display (such as an LCD), but rather could instead be an opaque touch pad as commonly disposed proximate space bars on laptop computers. Further, for touch panels having more than one electrode array, modular connectors could be used with only one array—for example the array associated with the receive electronics, or the array associated with the drive electronics. Not all electrodes associated with an electrode array need necessarily be coupled to modular connectors; some subset could be coupled to such connectors and other groups could be coupled using more traditional ribbon interconnects.

Figure 5:
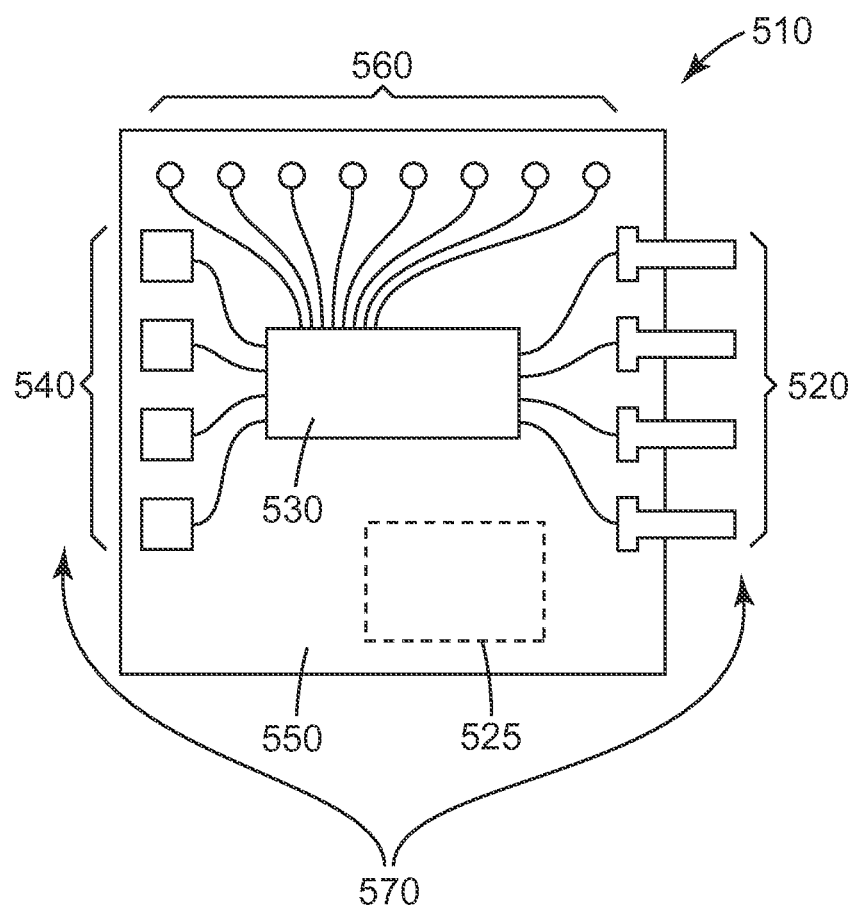

FIG. 5 is a drawing of modular connector 510. It includes substrate 550, which may comprise PCB, flex, or some combination thereof. Disposed thereon, modular connector electronics 530 may comprise an integrated circuit, possibly an ASIC. Modular controller electronics may additionally include drive and/or receive circuitry 525. Modular connector 510 additionally includes an electrode interface 560, which is comprised of a plurality of terminal areas (in this case eight, though other numbers are possible) which are designed for electrical coupling with electrodes from a touch sensitive device, such as individual electrodes of electrode array 350 in previous figures. Each of the terminal areas that comprise the electrode interface are communicatively coupled, by conductive leads disposed on substrate 550, to modular connector electronics. In one embodiment, the spacing of the terminal areas matches the pitch of the electrodes that comprise the electrode array; in another embodiment the spacing of the terminal areas is reduce as compared with the pitch of the electrodes in the electrode array (for example, the terminal areas are spaced at ½ mm, and the pitch of the electrodes is 5 mm), a ribbon tail fanning out to accommodate both in-between. Modular connector 510 additionally includes inter-module interface 570, which includes two respective sub-interfaces 520 and 540, each including four terminal areas (though other numbers are possible) for communicatively coupling to adjacent modular connectors, if present. As can be seen, the sub-interfaces that comprise inter-module interface 570 are positioned such that an adjacently disposed modular connector having a sub-interface 520 would be well positioned for electrical coupling to the terminal areas of sub-interface 540. This may also be referred to as daisy-chaining the modular connectors. The terminal areas of sub-interface 540 in one embodiment are conductive areas of the substrate. The terminal areas of sub-interface 520 are flexible conductors extending beyond the surface of substrate 550. As mentioned earlier, adjacent modular conductors may be electrically connected by use of soldering, or a Z-axis conductive adhesive. Similarly, the terminal areas that comprise the electrode interface 560 may be electrically coupled to electrodes associated with a touch panel by soldering or a Z-axis adhesive. Other methods of electrical coupling are also possible. Further, in another embodiment, modular connectors are mounted directly on the touch panel electrodes, in some cases avoiding circuit ribbon tails to match translate the pitch of the touch panel's conductors with the pitch of the modular connector's electrode interface.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. Further, the embodiments described in the claims as filed are to be understood as incorporated into this detailed description. Additionally, the scope of this detailed description should be read to include embodiments described in dependant claims as if such dependant claims were written as being dependant on any other claim or claims included herewith.

It should also be understood that all U.S. patents, patent application publications, and other patent and non-patent documents referred to herein are incorporated by reference, to the extent they do not contradict the foregoing disclosure.

The invention claimed is:

1. A modular connector for use with a touch sensor comprising at least one array of electrodes disposed proximate a touch sensitive area, comprising:
    a substrate;
    a modular connector electronics disposed on the substrate;
    an electrode interface disposed on the substrate and communicatively coupled to the connector electronics, the electrode interface including a plurality of terminal areas for making electrical connections with a subset of the array of electrodes;
    one or more inter-module interfaces disposed on the substrate and communicatively coupled to the connector electronics, the inter-module interfaces including a plurality of terminal areas for making electrical connections to another modular connector;
and wherein the terminal areas of the electrode interface are individually addressable by communication signals provided to the modular connector electronics via the inter-module interfaces.

2. The modular connector of claim 1, wherein the communications signals are provided to the modular connector electronics by an inter-module controller.

3. The modular connector of claim 1, wherein the inter-module interfaces comprise:
    one or more male plugs for connecting with female sockets of other modular connectors, and;
    one or more female sockets for connecting with male plugs of other modular connectors.

4. The modular connector of claim 1, wherein the terminal areas of the inter-module interfaces comprise conductive pads.

5. The modular connector of claim 1, wherein the substrate comprises a printed circuit board.

6. The modular connector of claim 4, wherein the printed circuit board comprises a flexible printed circuit board.

7. The modular connector of claim 4, wherein the printed circuit board comprises a hard flex printed circuit board, having an integral flex tail.

8. The modular connector of claim 1, wherein the modular connector electronics comprises an application specific integrated circuit.

9. The modular connector of claim 1, further comprising:
a drive signal generator, communicatively coupled to the modular connector electronics and the electrode interface, for applying drive signals to the subset of the array of electrodes.

10. The modular connector of claim 9, wherein communication signals provided to the modular connector electronics via the inter-module interfaces additionally control the drive signal generator.

11. The modular connector of claim 10, wherein, responsive to the communication signals, the modular connector electronics and the drive signal generator cause the drive signals to be applied to the electrodes of the subset one at a time.

12. The touch sensor of claim 10, further comprising:
an inter-module controller communicatively coupled to one of the modular connectors, the inter-module controller configured to communicatively interface with modular connectors and individually address any of the electrodes that comprise the array of electrodes.

13. The touch sensor of claim 12, wherein the inter-module controller may address more than one individual electrode of the array of electrodes at the same time.

14. The touch sensor of claim 12, wherein the modular connector further comprises:
a drive signal generator, communicatively coupled to the modular connector electronics and the electrode interface, for applying drive signals to the subset of the array of electrodes.

15. The touch sensor of claim 14, wherein communications signals provided from the inter-module controller via the inter-module interfaces control the drive signal generator.

16. The touch sensor of claim 15, wherein, responsive to communication signals provided from the inter-module controller, a drive signal is applied by the drive signal generator to electrodes of the subset of the array of electrodes one at a time.

17. The touch sensor of claim 12, wherein the modular connector further comprises:
sense electronics, communicatively coupled to the modular connector electronics and the electrode interface, for sensing signals occurring on the subset of the array of electrodes.

18. The touch sensor of claim 17, wherein communication signals provided to the modular connector electronics from the inter-module controller provide communicative coupling between the inter-module controller and the sense electronics.

19. The modular connector of claim 1, further comprising:
sense electronics, communicatively coupled to the modular connector electronics and the electrode interface, for sensing signals occurring on the subset of the array of electrodes.

20. The modular connector of claim 19, wherein communication signals provided to the modular connector electronics via the inter-module interfaces additionally provide communicative coupling between the inter-module interfaces and the sense electronics.

21. A touch sensor comprising:
an array of electrodes, the array comprising a plurality of electrodes proximate a touch sensitive area of the touch sensor;
a plurality modular connectors interconnected together, each modular connector electrically coupled to a subset of the array of electrodes, wherein the modular connectors comprise:
a substrate;
a modular connector electronics disposed on the substrate;
an electrode interface disposed on the substrate and communicatively coupled to the connector electronics, the electrode interface including a plurality of terminal areas for making electrical connections with a subset of the array of electrodes;
one or more inter-module interfaces disposed on the substrate and communicatively coupled to the connector electronics, the inter-module interfaces including a plurality of terminal areas for making electrical connections to other modular connectors;
and wherein the terminal areas of the electrode interface are individually addressable by communication signals provided to the modular connector electronics via the inter-module interfaces.

22. The touch sensor of claim 21, wherein the inter-module interfaces comprise:
a male plug for connecting with female sockets of other modular connectors, and;
a female socket for connecting with male plugs of other modular connectors.

23. The touch sensor of claim 21, further comprising a touch sensor drive unit that comprises electronics for providing drive signals to electrodes that comprise the array of electrodes, the touch sensor drive unit communicatively coupled to the inter-module controller.

24. The touch sensor of claim 23, wherein the touch sensor drive unit provides signals to the inter-module controller to provide drive signals to electrodes that comprise the array of electrodes one at a time.

25. The touch sensor of claim 21, further comprising a touch sensor receive unit that comprises electronics for receiving signals from electrodes that comprise the array of electrodes, the touch sensor receive unit communicatively coupled to the inter-module controller.

* * * * *